United States Patent [19]
Kubota

[11] Patent Number: 5,245,581
[45] Date of Patent: Sep. 14, 1993

[54] SEMICONDUCTOR MEMORY DEVICE WITH RAPID SENSE AMPLIFICATION

[75] Inventor: Yasushi Kubota, Sakurai, Japan

[73] Assignee: Sharp Kabushiki Kaishi, Osaka, Japan

[21] Appl. No.: 668,307

[22] Filed: Mar. 13, 1991

[30] Foreign Application Priority Data

Mar. 19, 1990 [JP] Japan .................. 2-69215

[51] Int. Cl.[5] .............................................. G11C 11/34
[52] U.S. Cl. ........................................ 365/207; 365/208; 307/530
[58] Field of Search ............... 365/190, 194, 205, 207, 365/208, 233; 307/530

[56] References Cited

U.S. PATENT DOCUMENTS

| | | | |
|---|---|---|---|
| 4,791,616 | 12/1988 | Taguchi et al. | 365/205 |
| 4,926,381 | 5/1990 | Fujii | 365/207 X |
| 5,111,434 | 5/1992 | Cho | 365/207 |

OTHER PUBLICATIONS

M. Koyanagi, Submicron Device I, pp. 68–69 with English abstract, Jul. 31, 1987.

Primary Examiner—Robert J. Pascal
Assistant Examiner—Seung Ham
Attorney, Agent, or Firm—Nixon & Vanderhye

[57] ABSTRACT

In each of the sense amplifiers of a DRAM, the common source terminal of pull-down transistors which are connected to a bit line pair is connected to a discharge line through first and second current paths. One end of the discharge line is grounded. The first and second current paths are provided with first and second switches, respectively. The first and second switches are independently controlled by a different signal. The first current path is further provided with a third switch. The third switch is turned on when the potentials of both of the bit lines are greater than a threshold, and turned off when one of the potentials is not greater than the threshold.

10 Claims, 8 Drawing Sheets

SEMICONDUCTOR MEMORY DEVICE WITH RAPID SENSE AMPLIFICATION

BACKGROUND OF THE INVENTION

1. Field of the Invention

This invention relates to a semiconductor memory device such as a dynamic random access memory (DRAM), or a static random access memory (SRAM), and more particularly to a semiconductor memory device in which sense amplifiers conduct the sensing process at high speed so that the access time can be shortened.

2. Description of the Prior Art

FIG. 8 shows a conventional DRAM. The DRAM of FIG. 8 comprises sense amplifiers of the differential type SA0, SA1, . . . , SAn which are arranged in one direction, pairs of bit lines B0 and $\overline{B0}$, B1 and $\overline{B1}$, . . . , Bn and $\overline{Bn}$, and word lines W1, W2, . . . which intersect with the bit lines. At crossings of the bit lines and the word lines W1, W2, . . . , memory cells M are formed which are connected to the bit lines and the word lines W1, W2, . . . , respectively. In the accompanying drawings, for the sake of simplification, P-MOS pull-up transistors for sense amplifiers SA0, SA1, . . . , SAn are omitted, and only a pair of N-MOS pull-down transistors NT1 and NT2 are shown as components of each of the sense amplifier SA0, SA1, . . . , SAn. All of common source terminals S0, S1, . . . , Sn of the N-MOS pull-down transistor pairs NT1 and NT2 are connected a discharge line $\overline{SAN}$ one end of which is grounded through a transistor Q. Hereinafter, when ones of the sense amplifiers, the bit lines, and the common source terminals are stated as typical examples of these components, these are sometimes referenced by SAi, Bi and $\overline{Bi}$, and Si, respectively.

FIG. 9 shows another conventional DRAM. The DRAM of FIG. 9 has the same construction as that of FIG. 8 except that one end of the discharge line $\overline{SAN}$ is grounded through a parallel circuit of transistors Q1 and Q2. The conductance of the transistor Q1 is smaller than that of the transistor Q2.

The operation of these DRAMs will be described. When data is to be read from one of the memory cells M, the bit line pairs B0 and $\overline{B0}$, . . . , Bn and $\overline{Bn}$ are charged to an intermediate potential $V_{cc}/2$. Then, one of the word lines W1, W2, . . . is selected to be activated in accordance with an input address signal. The memory cells M connected to the selected word line are coupled to the corresponding bit lines Bi or $\overline{Bi}$, so that a minute potential difference the degree of which corresponds to the level of the charge stored in the memory cells M appears between the bit lines Bi and $\overline{Bi}$. Thereafter, the potential of the discharge line $\overline{SAN}$ is lowered from the intermediate potential $V_{cc}/2$ to the ground level, thereby causing the corresponding sense amplifier SAi to differentially amplify this potential difference. Namely, the potential of one of the bit line pair Bi and $\overline{Bi}$ which is lower is reduced to zero while that of the other bit line which is higher is maintained. If the potential of the common source terminal Si is rapidly lowered during this process, the sensitivity of the sense amplifier SAi may drop, resulting in a possible malfunction of the sense amplifier.

In order to prevent this phenomenon from occurring, a counter measure is taken in a conventional DRAM. In the DRAM of FIG. 8, as shown in FIG. 10, the gate potential $\phi$ of the transistor Q is raised at time $t_1$ to a voltage $V_m$ which is slightly lower than the power source voltage $V_{cc}$, and the sense amplifier SAi begins to operate gently (initial amplification). After the potential difference between the bit lines Bi and $\overline{Bi}$ has sufficiently widened (i.e., after time $t_2$), the gate potential $\phi$ is further raised to the power source voltage $V_{cc}$, and the sense amplifier SAi performs its full operation (main amplification). In the DRAM of FIG. 9, the two-stage amplification is conducted in order to prevent the sense amplifiers Sai from erroneously operating, as described below. First, as shown in (a) of FIG. 11, the gate potential $\phi'1$ of the transistor Q is raised at time $t_1$ to the power source voltage $V_{cc}$ so that the transistor Q1 having a smaller conductance is turned on and initial amplification is performed. After the potential difference between the bit lines Bi and $\overline{Bi}$ has sufficiently widened (i.e., after time $t_2$ ((b) of FIG. 11)), the gate potential $\phi'2$ of the transistor Q2 is raised to the power source voltage $V_{cc}$, whereby the transistor Q2 having a larger conductance is turned on. Thereafter main amplification is performed.

As described above, the common source terminal Si of each sense amplifier SAi is connected to the discharge line $\overline{SAN}$ at a position nearest to the respective sense amplifier SAi. In the discharge line $\overline{SAN}$, portions between these connecting positions function as resistors r. Each of the sense amplifiers SAi exhibits the function of a load capacitance. When the gate potential $\phi$ or $\phi'1$ is raised to turn on the transistor Q or Q1, therefore, the potential of the common source terminal S0 which is closest to the ground GND drops relatively rapidly, and, in contrast, that of the common source terminal Sn which is remotest from the ground GND drops slowly. In other words, in the sense amplifier SAn positioned far from the ground GND, the commencement of initial amplification is delayed. In a conventional semiconductor memory device, consequently, the overall time period required for performing initial amplification in all sense amplifiers (in the above-mentioned DRAMs, the time period from when the gate potential $\phi$ or $\phi'1$ is raised and until when the remotest sense amplifier SAn operates and the potential difference between the bit lines Bn and $\overline{Bn}$ becomes sufficiently large) is long. This makes the access time longer.

SUMMARY OF THE INVENTION

The semiconductor memory device of this invention, which overcomes the above-discussed and numerous other disadvantages and deficiencies of the prior art, comprises: pairs of bit lines; sense amplifiers arranged in one direction, each of said sense amplifiers having two or more pull-down transistors, one terminal of each of said pull-down transistors being connected to the corresponding one of said pair of bit lines; and a discharge line elongated along said direction, one end of said discharge line being grounded, and further comprises: first and second current paths, one end of said first current path and one end of said second current path being connected to another terminal of each of said pull-down transistors, the other end of said first current path and the other end of said second current path being connected to said discharge line; first and second switch means respectively connected in said first and second current paths, said first and second switch means being independently controlled by different driving signals; and third switch means connected in said first current path, said third switch means being disposed between said other terminal and said first switch means.

Preferably, said third switch means comprises two transistors connected in series.

Preferably, the gate of one of said transistors is connected to said one terminal of one of said pull-down transistors, and the gate of the other one of said transistors is connected to said one terminal of the other one of said pull-down transistors.

Preferably, said third switch means is turned on when the potentials of both of the corresponding bit lines are greater than a threshold value, and turned off when the potential of at least one of said corresponding bit lines is smaller than said threshold value, said threshold value being between the preliminary charge level and the ground level.

Preferably, said sense amplifiers perform first sense amplification from when said corresponding first switch means is turned on and until when said corresponding third switch means is turned off, and then said sense amplifiers perform second sense amplification during when said second switch means is turned on.

Preferably, said memory device further comprises fourth switch means connected in said first current path.

Preferably, said fourth switch means is disposed between said first switch means and said discharge line.

Preferably, said fourth switch means is turned on when the potential difference between the pull-down transistor side and discharge line side of said first current path is greater than a predetermined value, and turned off when said potential difference is not greater than said predetermined value.

Preferably, said first switch means for all of said sense amplifiers are controlled commonly by one driving signal.

Preferably, said second switch means for all of said sense amplifiers are controlled commonly by one driving signal.

In the semiconductor memory device according to the invention, after word lines are activated and a minute potential difference appears between bit lines, a driving signal is produced to turn on the first switch means. At this time, the potential of the bit lines is in the vicinity of the precharge level, and the third switch means is on. When the first switch means is turned on, therefore, the pull-down transistors of each sense amplifier are connected through the first current path to the discharge line which is at the ground level. In this process, the operation of sense amplifiers positioned far from the ground may be delayed by the signal delay in the wiring through which the drive signal is applied to the first switch means. This delay caused by the wiring can be easily reduced by employing as the first switch means devices having a small load capacitance (such as MOS transistors). In this case, with a time delay from the input of the driving signal, each sense amplifier starts the first stage of sense amplification (initial amplification). This time delay is shorter than that in a prior art device. With the progress of initial amplification, the potentials of the bit lines gradually drop. When the potential of at least one of the bit lines becomes below a threshold value, the third switch means is turned off, thereby the first current path is opened. This threshold value of the third switch means is suitably selected so that, even when the sense amplifiers fully operate while the potentials of the bit lines are between the precharge level and the ground level, the sense amplifiers do not erroneously operate. That is, when the potentials of the bit lines drop to a level at which the corresponding sense amplifier does not malfunction (hereinafter, this level is referred to as "non-malfunction level"), the first current path is opened, thereby initial amplification of the sense amplifier is automatically completed. The potential of the bit lines for a sense amplifier which is near the ground reaches the non-malfunction level, faster than that of the bit lines for a sense amplifier which is remote from the ground. This causes the current flowing from a sense amplifier which is near the ground to the discharge line to be interrupted during the time when a sense amplifier which is remote from the ground is performing initial amplification. As a result, the potential of a portion of the discharge line which portion is remote from the ground can be sufficiently lowered. Consequently, a sense amplifier which is remote from the ground can operate rapidly, resulting in that the time period required for initial amplification is short. According to the invention, a sense amplifier which is remote from the ground starts initial amplification earlier than that in a prior art device, and completes initial amplification in a shorter time. Therefore, the time period for initial amplification in all sense amplifiers is short, with the result that the access time is shortened.

In an embodiment in which the third switch means comprises two transistors connected in series, the gates of the transistors may be respectively connected to the terminals of the pull-down transistors which are connected to the bit lines. In this case, the first current path is opened when one of the bit lines drops below the above-mentioned non-malfunction level. Even when the potential of the other one of the bit lines is raised to any level, therefore, the first current path is surely opened so that initial amplification is certainly completed.

In an embodiment having fourth switch means connected in the first current path, the fourth switch means is turned on when the potential difference between the pull-down transistor side and the discharge line side of the first current path is greater than a predetermined value, and turned off when the potential difference is not greater than the predetermined value. The timing for opening the first current path can be easily set by adequately selecting the threshold values of the third and fourth switch means.

Thus, the invention described herein makes possible the objectives of:

(1) providing a semiconductor memory device in which the overall time period required for performing initial amplification in all sense amplifiers can be shortened; and (2) providing a semiconductor memory device in which the access time can be shortened.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
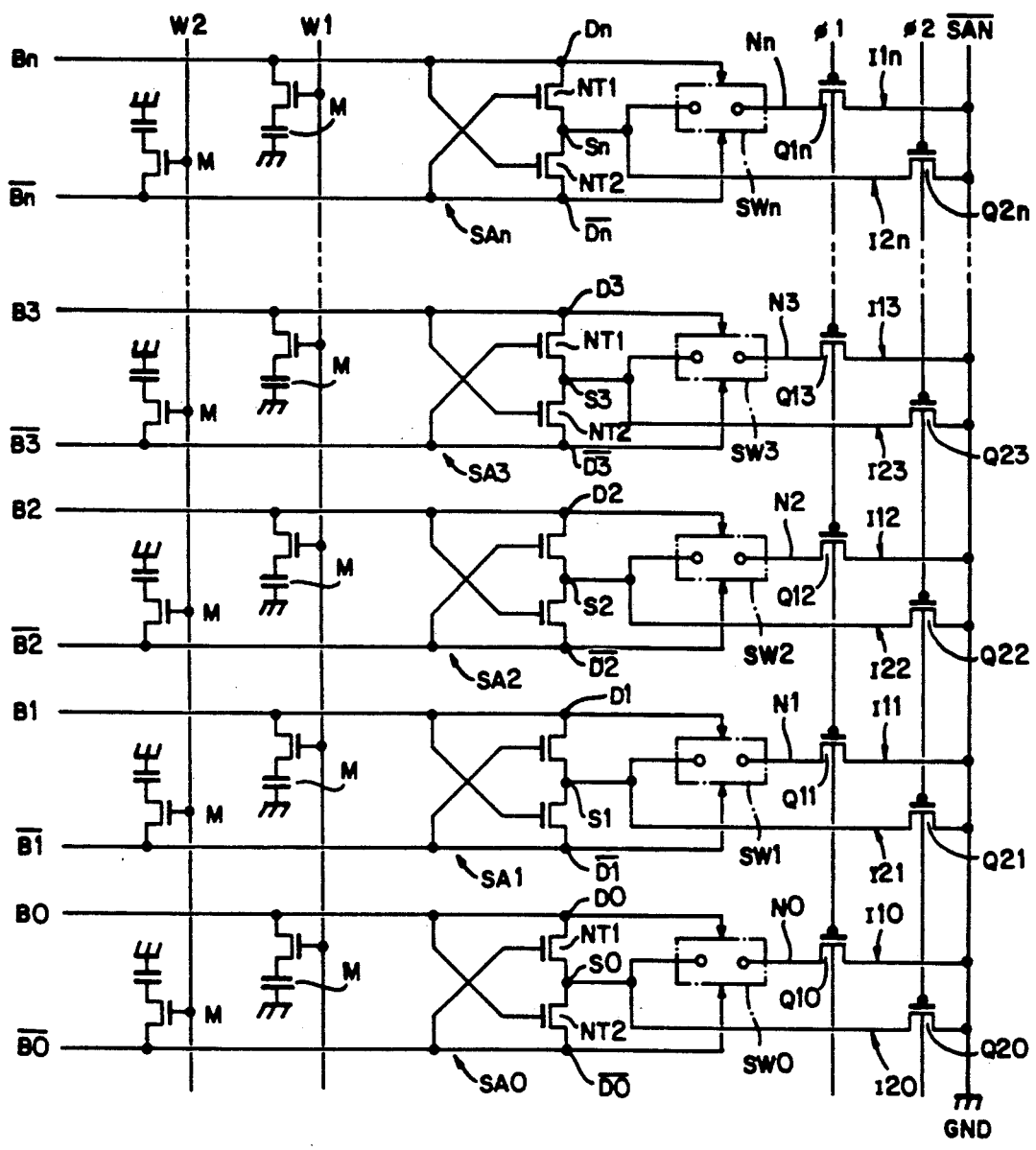
FIG. 1 is a circuit diagram showing an embodiment of the invention.
Figure 8:
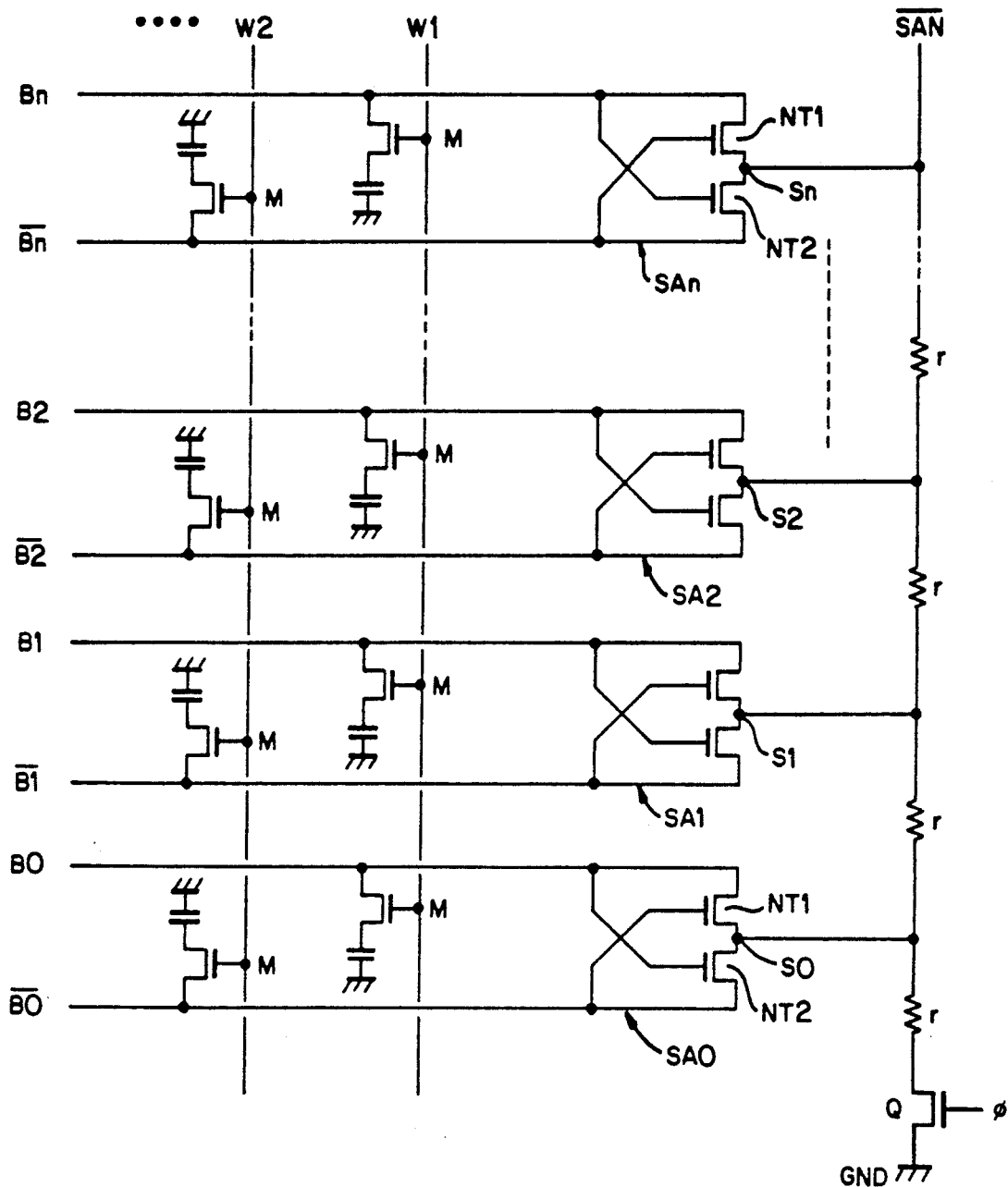
FIG. 8 is a circuit diagram showing a conventional DRAM.
Figure 9:
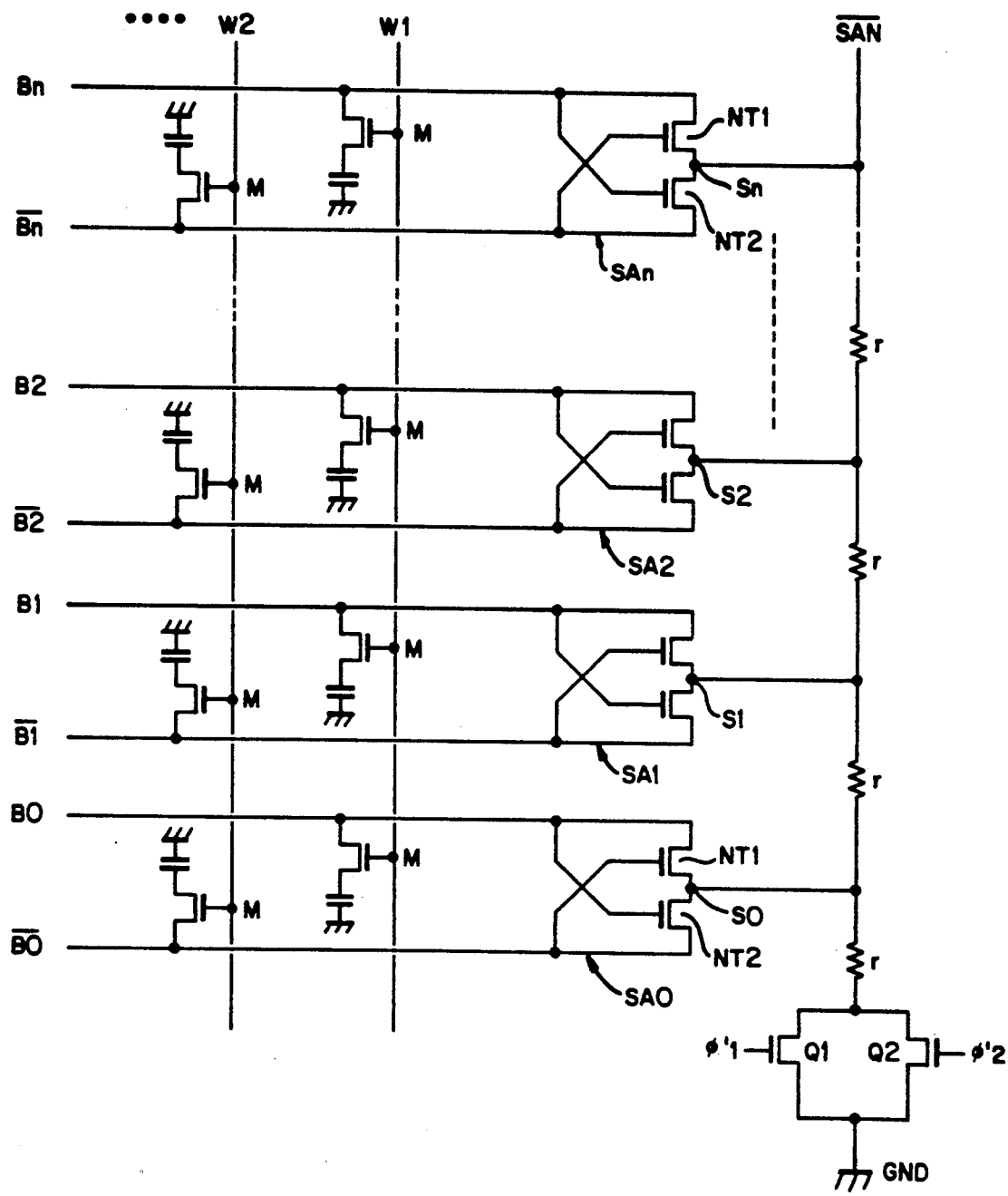
FIG. 9 is a circuit diagram showing another conventional DRAM.
Figure 10:
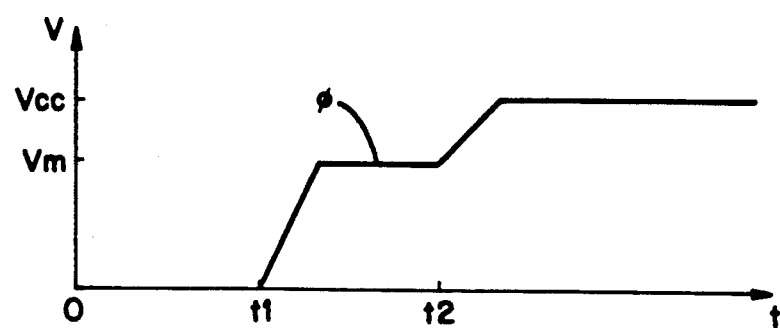
FIG. 10 is a timing chart illustrating the operation of the DRAM of FIG. 8.
Figure 11A:
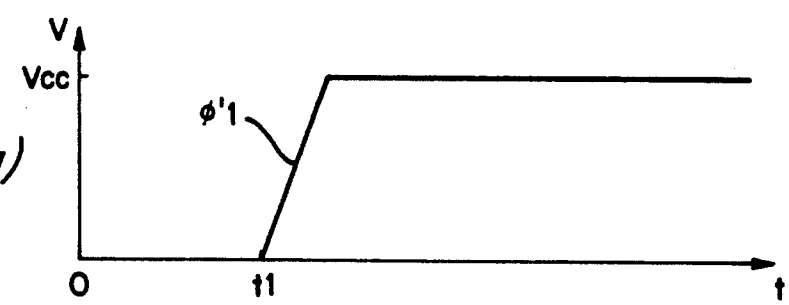
FIGS. 11(a), 11(b) are a timing chart illustrating the operation of the DRAM of FIG. 9.
Figure 11B:
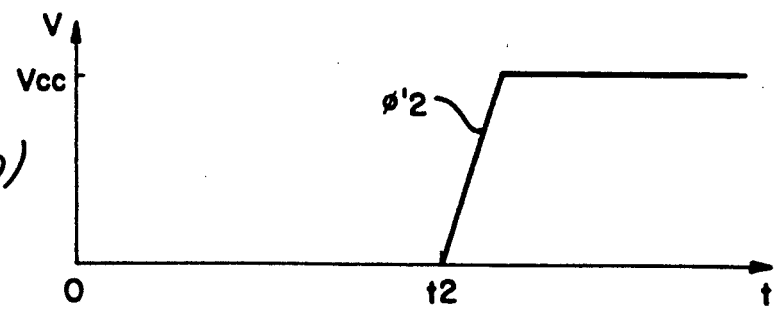

FIG. 1 shows a DRAM according to the invention. The DRAM of FIG. 1 comprises memory cells M, word lines w1, W2, . . . , sense amplifiers SA0, . . . , SAn, and pairs of bit lines B0 and $\overline{B0}$, . . . , Bn and $\overline{Bn}$. These components are similar in configuration to those of the DRAMs of FIGS. 8 and 9. The drain terminals Di and $\overline{Di}$ of the pull-down transistors NT1 and NT2 of each sense amplifier SAi are connected to the corresponding bit lines Bi and $\overline{Bi}$, respectively. The common source terminal Si of each sense amplifier SAi is connected to first and second current paths I1i and I2i. The other ends of the first and second current paths I1i and I2i are connected to a discharge line SAN which elongates along the direction of arrangement of the sense amplifiers SA0, . . . , SAn. The positions where the first and second current paths I1i and I2i are connected to the discharge line $\overline{SAN}$ are selected so as to be in the vicinity of the corresponding sense amplifier SAi.

N-MOS transistors Q10, . . . , Q1n (first switch means) are respectively disposed in the first current paths I10, . . . , I1n, and other N-MOS transistors Q20, . . . , Q2n (second switch means) are respectively disposed in the second current paths I20, . . . , I2n. A signal wire is commonly connected to the gates of all of the transistors Q10, . . . , Q1n, and another signal wire is commonly connected to the gates of all of the transistors Q20, . . . , Q2n. Through these signal wires, driving signals $\phi1$ and $\phi2$ are applied to the gates of the transistors Q1i and Q2i, respectively. In the first current path I1i, a switch SWi (third switch means) is disposed between the common source terminal Sn and the N-MOS transistor Q1i.

The switch SWi turns on when both the following two potential differences are greater than a predetermined threshold value, and turns off when at least one of the following two potential differences is not greater than the predetermined threshold value: the first one is the potential difference between the drain terminal Di of the first pull-down transistor NT1 and a node Ni of the switch SWi which is on the side of the discharge line $\overline{SAN}$; and the second one is the potential difference between the drain terminal $\overline{Di}$ of the second pull-down transistor NT2 and the node Ni of the switch SWi. In other words, the first potential difference is the potential of the bit line Bi, and the second potential difference the potential of the bit line $\overline{Bi}$.

Figure 2:
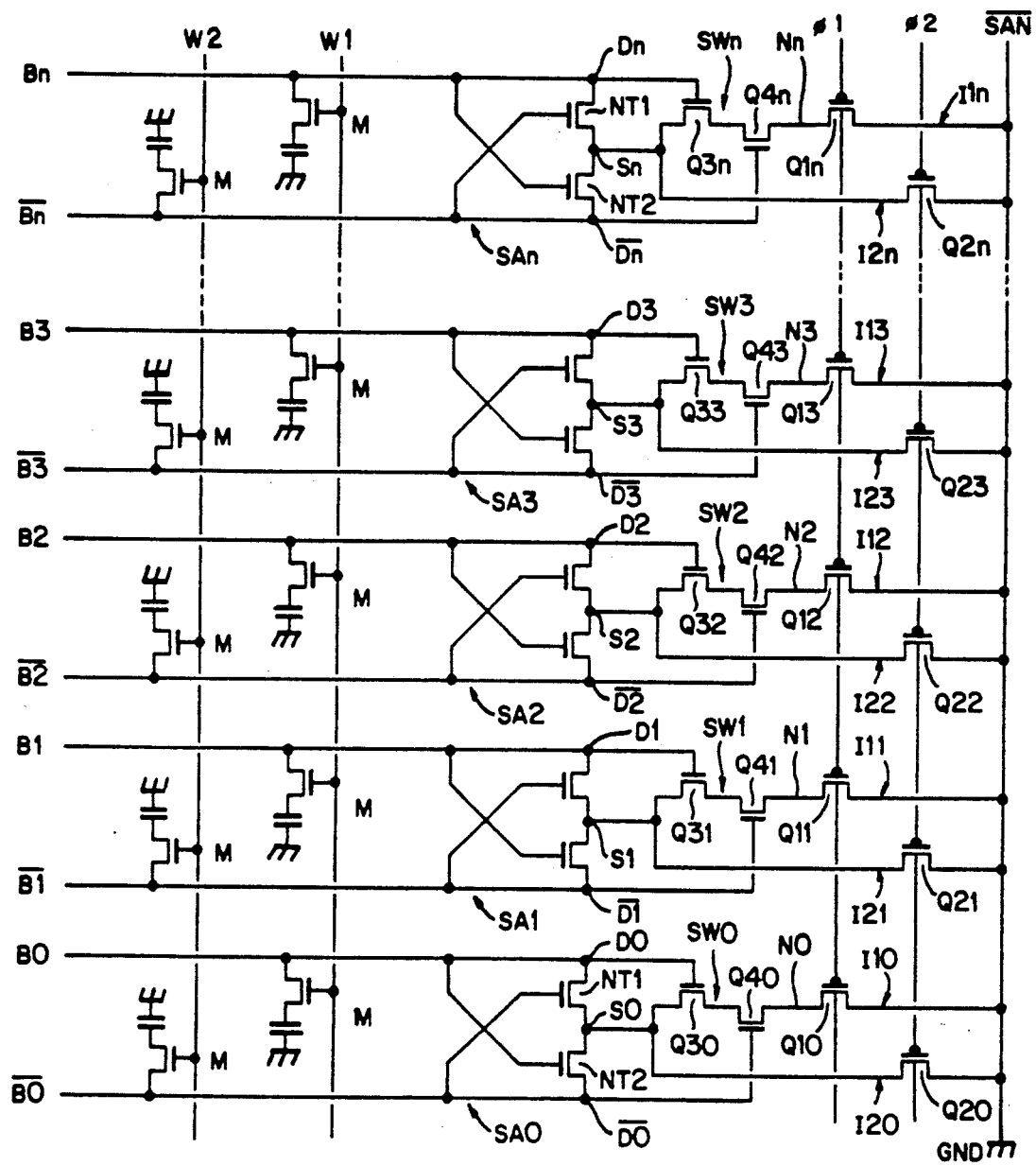
FIG. 2 is a circuit diagram showing more specifically the third switch means used in the embodiment of FIG. 1.

In FIG. 2, the switch SWi is shown more specifically. The switch SWi comprises a series circuit of two N-MOS transistors Q3i and Q4i. The gate terminal of the transistor Q3i is connected to the drain terminal Di of the transistor NT1, and the gate terminal of the transistor Q4i is connected to the drain terminal $\overline{Di}$ of the transistor NT2. The threshold value $V_{thn}$ of the transistors Q3i and Q4i are set to a value which is between the intermediate potential $V_{cc}/2$ and the ground level ($=0$) and under which, even when the sense amplifier SAi operates with its all ability, it does not malfunction.

When sense amplification is to be performed, one of the word lines Wi is selectively activated, and then a minute potential difference appears between each pair of the bit lines Bi and $\overline{Bi}$ which are previously charged to the intermediate potential $V_{cc}/2$. Since the gate potential of each of the transistors Q3i and Q4i exceeds the threshold value $V_{thn}$, the transistors Q3i and Q4i are turned on. Thereafter, the signal $\phi1$ is raised at time $t_1$ to the power source voltage $V_{cc}$, and the transistors Q1i are turned on. In each sense amplifier SAi, at the instance when the respective transistor Q1i is turned on, the common source terminal Si is connected through the first current path I1i to the discharge line $\overline{SAN}$ which is at the ground level. After the common source terminal Si has been connected to the discharge line $\overline{SAN}$, the sense amplifier SAi starts initial amplification with a time delay which corresponds to a time delay caused by the wiring for transmitting the signal $\phi1$. A signal source for the signal $\phi1$ is coupled to the end of this wiring which is on the side of the sense amplifier SA0. Since only the transistors Q10, Q11, . . . , Q1n which have a small gate capacitance are connected to this wiring, however, the time delay caused by this wiring is short even for the sense amplifier SAn which is remote from the ground GND. Therefore, the sense amplifier SAi starts initial amplification in a shorter time than those in the prior art. Since three transistors Q3i, Q4i and Q1i are connected in series in each of the first current path I1i, the conductance of the first current paths I1i is low, with the result that initial amplification is started gradually.

In the sense amplifier SAi, initial amplification progresses, and the level of one of the bit lines Bi and $\overline{Bi}$ which are complementary to each other (e.g., the level of the bit line Bi) is lowered toward the ground level. During this process, when the level of the bit line Bi drops toward the ground level and the potential difference between the drain terminal Di and the node Ni falls below the threshold value $V_{thn}$, the transistor Q3i is turned off so that the first current path I1i is opened. Namely, when the level of the bit line Bi reaches the non-malfunction level (the level at which the sense amplifier SAi does not malfunction even when it operates with its all ability), the first current path I1i is opened. In the case wherein the level of the bit line $\overline{Bi}$ is lowered to the ground level, the first current path I1i is opened by the turn off operation of the transistor Q4i. In this way, initial amplification by the sense amplifier SAi is automatically completed.

Figure 4A:
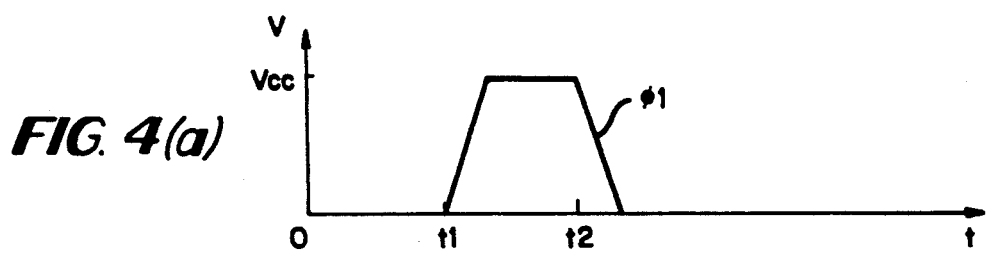
FIGS. 4(a), 4(b) are a timing chart illustrating the operation of the embodiment of FIG. 1.
Figure 4B:

The levels of the common source terminals S0 and S1 in sense amplifiers such as the sense amplifiers SA0 and SA1 which are positioned near the ground GND reach the non-malfunction level earlier than that of the source terminal Sn in the sense amplifier SAn which is remote from the ground GND. Therefore, the currents flowing from the sense amplifiers SA0 and SA1 to the discharge line $\overline{SAN}$ are interrupted during the time when the sense amplifier SAn is under an initial amplification state. This ensures that the potential of a portion of the discharge line $\overline{SAN}$ which portion is remote from the ground GND can drop sufficiently. Hence, sense amplifiers such as the sense amplifier SAn which are remote from the ground GND can operate rapidly, and the time period required for initial amplification in such sense amplifiers is short. According to the invention, initial amplification in sense amplifiers such as the sense amplifier SAn which are remote from the ground GND can be started earlier than in the prior art, and completed in a shorter period of time. Initial amplification in all of the sense amplifiers can be performed faster, and the access time can be shortened. After initial amplification in all of the sense amplifiers SA0, ..., SAn, as shown in (b) of FIG. 4, the signal $\phi 2$ is raised to the level of the power source voltage $V_{cc}$ to turn on the transistors Q20, ..., Q2n, thereby closing the second current paths I20, ..., I2n. Then, main amplification in the sense amplifiers is performed.

Figure 3:
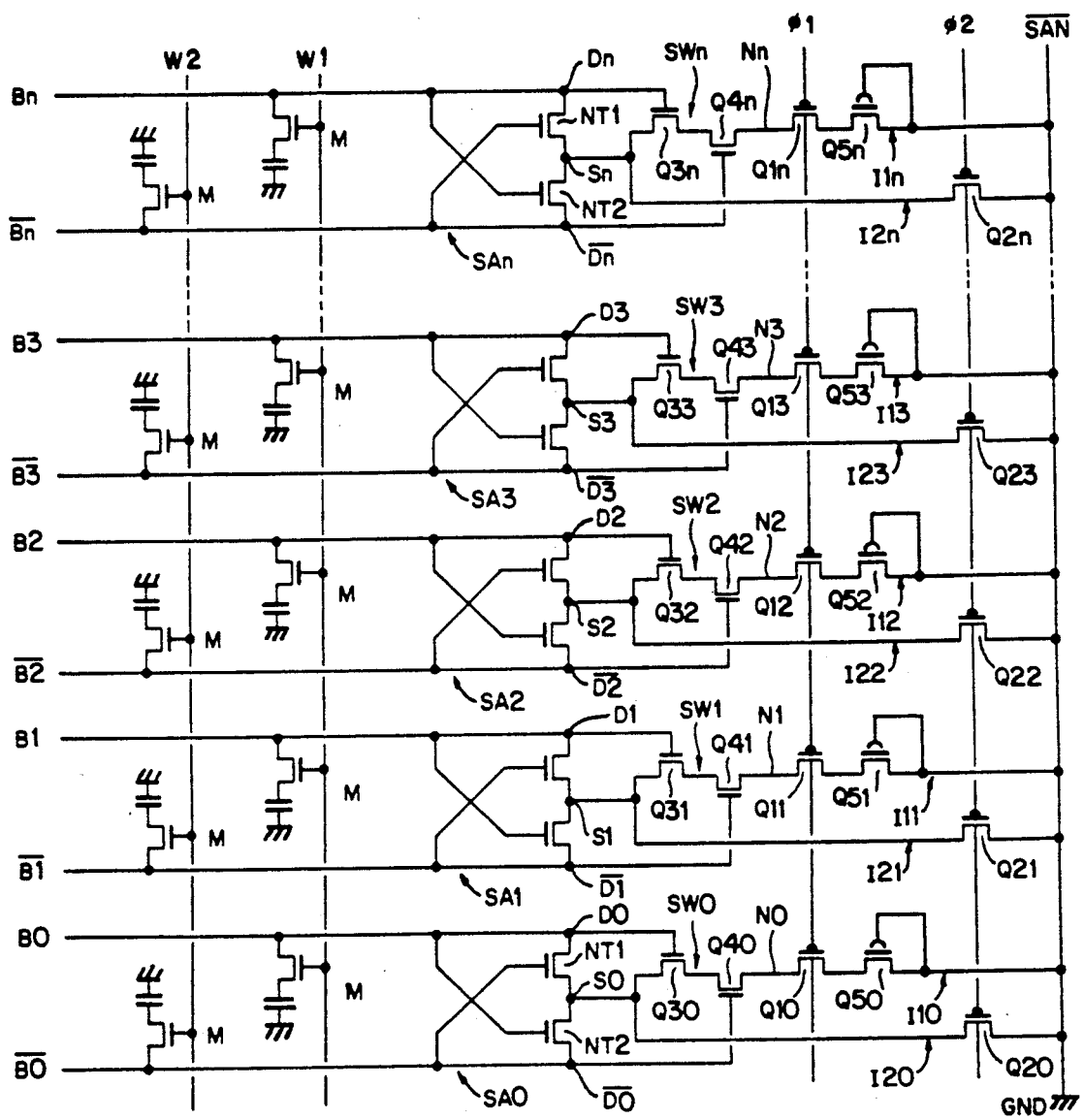
FIG. 3 is a circuit diagram showing another embodiment of the invention.

FIG. 3 shows another DRAM according to the invention. This embodiment comprises P-MOS transistors Q50, ..., Q5n (fourth switch means) which are respectively connected in the first current paths I10, ..., I1n. In the first current path I1i, the transistor Q5i is disposed between the transistor Q1i and the discharge line $\overline{SAN}$. The gate terminal of the transistor Q5i is connected to the first current path I1i on the side of the discharge line $\overline{SAN}$. The transistor Q5i turns on when the potential difference between the portions of the first current path I1i which are respectively on the side of the transistor Q1i and on the side of the discharge line $\overline{SAN}$ is greater than a prefixed threshold value $V_{thp}$, and turns off when this potential difference is not greater the threshold value $V_{thp}$. According to this embodiment, the timing for opening the first current path I1i can be arbitrarily set by adequately selecting the threshold value $V_{thp}$ of the transistor Q5i and the threshold value $V_{thn}$ of the transistors Q3i and Q4i. When the first current path I1i is closed, the four transistors Q3i, Q4i, Q1i and Q5i are connected in series, whereby reducing the conductance of the first current path I1i. This allows initial amplification to be started more gradually.

Figure 5A:
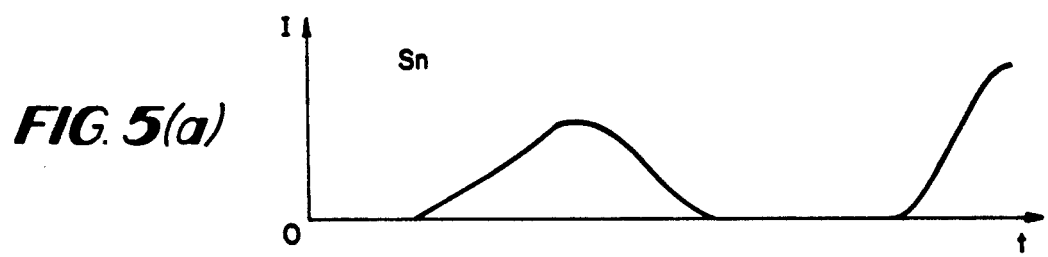
FIG. 5(a)-5(c) are a timing chart illustrating the operation of the embodiment of FIG. 3.
Figure 5B:
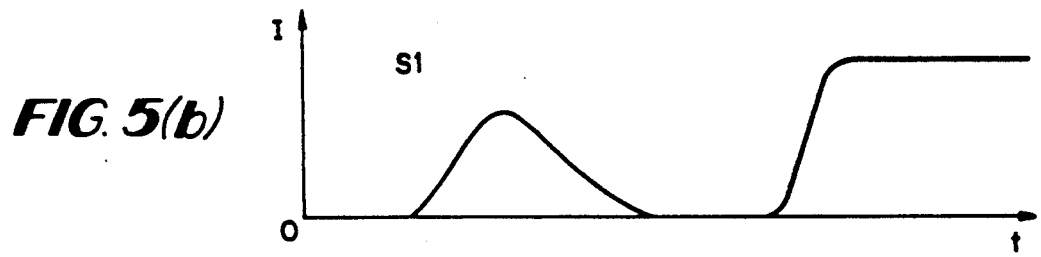
Figure 5C:
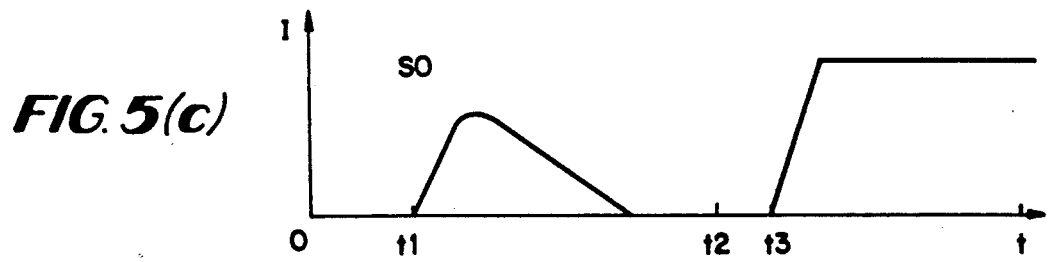

FIG. 5 shows current waveforms appearing in sense amplification in the DRAM of FIG. 3. The waveform in (a) of FIG. 5 illustrates a current flowing the common source terminal Sn of the sense amplifier SAn which is remote from the ground GND. In (b) and (c) of FIG. 5, waveforms of currents are shown which flow the common source terminals S0 and S1 of the sense amplifiers SA0 and SA1 which are near the ground GND, respectively. As seen from FIG. 5, in the sense amplifiers SA0 and SA1, initial amplification is completed and the current flow is suspended, at a relatively early stage, resulting in that the current flowing through the sense amplifier SAn which is remote from the ground increases and the completion of its initial amplification is hastened.

Figure 6:
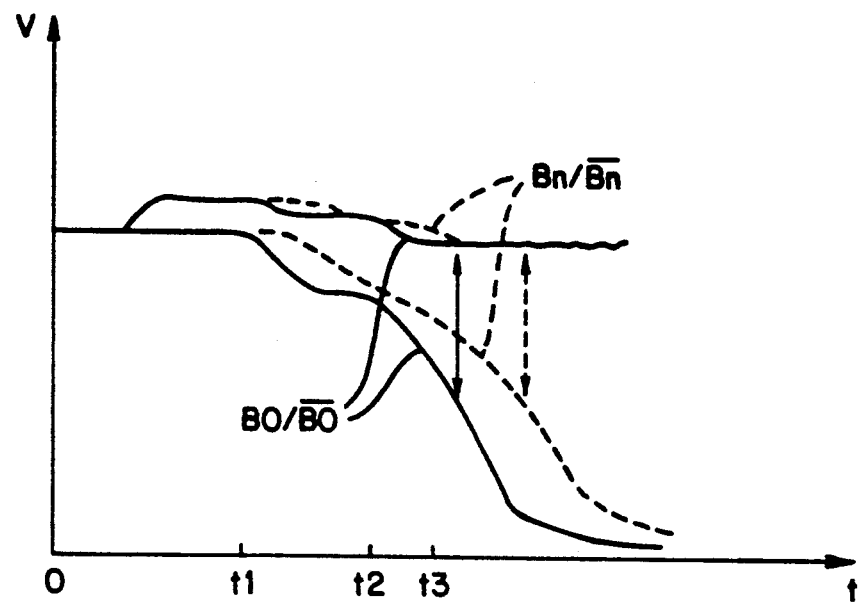
FIG. 6 shows the results of simulated data read operations in the embodiment of FIG. 3.
Figure 7:
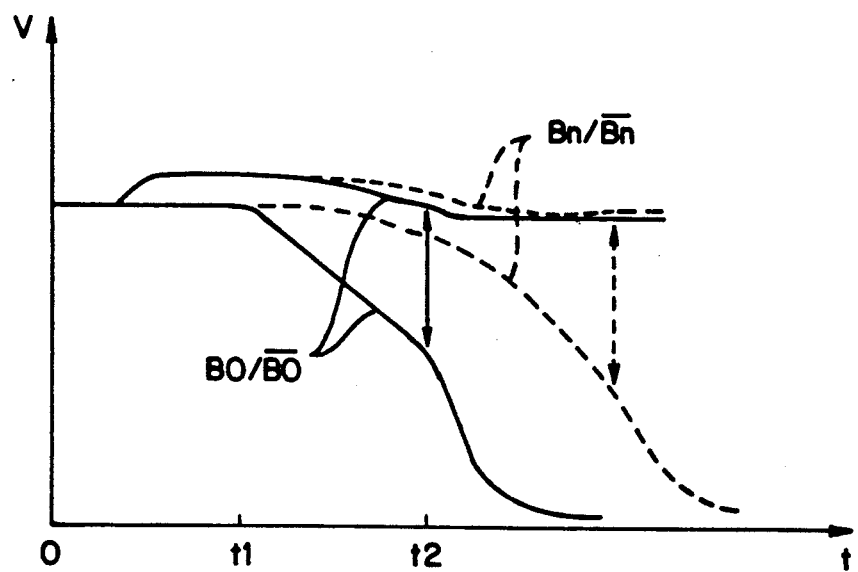
FIG. 7 shows the results of simulated data read operations in a conventional DRAM.

FIG. 6 shows the results of simulated data read operations in the DRAM of FIG. 3, and FIG. 7 shows those in a conventional DRAM. In these figures, the solid lines indicate the potential variation of the bit line pair B0 and $\overline{B0}$ which are positioned close to the ground, and the broken lines that of Bn and $\overline{Bn}$ which are positioned remote from the ground. In the embodiment, since sense amplification is temporarily suspended after the completion of initial amplification, sense amplification for the bit line pair B0 and $\overline{B0}$ which are positioned close to the ground is completed slightly later than that in a prior art device (as shown by the solid line arrows in FIGS. 6 and 7). However, sense amplification for the bit line pair Bn and $\overline{Bn}$ which are positioned remote from the ground is completed much earlier than that in a prior art device (as shown by the broken line arrows in FIGS. 6 and 7). According to the invention, therefore, the overall time period for initial amplification in all of the sense amplifiers is short, and the access time can be shortened as a whole.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor memory device having pairs of bit lines and sense amplifiers arranged in one direction, each of said sense amplifiers having two pull-down transistors, a first terminal of each of said pull-down transistors being connected to a corresponding one of said bit lines, a second terminal of a first of the pull-down transistors being connected to a second terminal of a second of the pull-down transistors through a common source terminal, a discharge line elongated along said direction, one end of said discharge line being grounded, wherein for said sense amplifiers the improvement comprises:

first and second current paths, a first end of said first current path and a first end of said second current path being connected to said common source terminal, a second end of said first current path and a second end of said second current path being connected to said discharge line;

first and second switch means respectively connected in said first and second current paths, said first and second switch means being independently controlled by different driving signals; and third switch means connected in said first current path, said third switch means being disposed between said common source terminal and said first switch means.

2. A semiconductor memory device according to claim 1 wherein said third switch means comprises two transistors connected in series.

3. A semiconductor memory device according to claim 2 wherein a gate of one of said transistors of said third switch means is connected to said first terminal of said first of the pull-down transistors, and a gate of the other one of said transistors of said third switch means is connected to said first terminal of the second of the pull-down transistor.

4. A semiconductor memory device according to claim 1 wherein said third switch means is turned on when voltage potentials of both of the corresponding bit lines are greater than a threshold value, and turned off when a voltage potential of at least one of said corresponding bit lines is smaller than said threshold value, said threshold value being between the a voltage level to which said bit lines are charged preliminarily and the ground level.

5. A semiconductor memory device according to claim 4 wherein said sense amplifiers perform first sense amplification from when said corresponding first switch means is turned on and until when said corresponding third switch means is turned off, and then said sense amplifiers perform second sense amplification during when said second switch means is turned on.

6. A semiconductor memory device according to claim 1 wherein said memory device further comprises fourth switch means connected in said first current path.

7. A semiconductor memory device according to claim 6 wherein said fourth switch means is disposed between said first switch means and said discharge line.

8. A semiconductor memory device according to claim 6 wherein said fourth switch means is turned on when a potential difference between a pull-down transistor side and discharge line side of said first current path is greater than a predetermined value, and turned off when said potential difference is not greater than said predetermined value.

9. A semiconductor memory device according to claim 1 wherein said first switch means for all of said sense amplifiers are controlled commonly by one driving signal.

10. A semiconductor memory device according to claim 1 wherein said second switch means for all of said sense amplifiers are controlled commonly by one driving signal.

* * * * *

UNITED STATES PATENT AND TRADEMARK OFFICE
CERTIFICATE OF CORRECTION

PATENT NO.   : 5,245,581
DATED        : September 14, 1993
INVENTOR(S)  : Yasushi KUBOTA It is certified that error appears in the above-indentified patent and that said Letters Patent is hereby corrected as shown below:

Col. 8, line 62, delete "the"

Signed and Sealed this

Twelfth Day of April, 1994

Attest:

BRUCE LEHMAN

*Attesting Officer*        *Commissioner of Patents and Trademarks*

UNITED STATES PATENT AND TRADEMARK OFFICE
CERTIFICATE OF CORRECTION

PATENT NO. : 5,245,581
DATED     : September 14, 1993
INVENTOR(S) : Yasushi Kubota It is certified that error appears in the above-indentified patent and that said Letters Patent is hereby corrected as shown below:

On the title page, Item [73] Assignee: "Sharp Kabushiki Kaishi" should be --Sharp Kabushiki Kaisha--.

Signed and Sealed this

Fourteenth Day of June, 1994

Attest:

BRUCE LEHMAN

*Attesting Officer*    *Commissioner of Patents and Trademarks*